United States Patent [19]

Dale

[11] Patent Number: 4,724,613
[45] Date of Patent: Feb. 16, 1988

[54] METHOD OF MAKING POTTED ELECTRONIC COMPONENTS

[75] Inventor: Graham S. Dale, Colchester, England
[73] Assignee: Pickering Electronics Limited, England
[21] Appl. No.: 854,323
[22] Filed: Apr. 21, 1986
[30] Foreign Application Priority Data
Apr. 26, 1985 [GB] United Kingdom ............... 8510621
[51] Int. Cl.[4] .................. H05K 13/00; H01H 5/02; H01H 5/04
[52] U.S. Cl. ........................... 29/856; 29/855; 29/513
[58] Field of Search .......... 29/505, 509, 513, 854–856; 336/96; 174/52 PE; 264/272.11, 272.18, 272.19

[56] References Cited
U.S. PATENT DOCUMENTS

| | | | |
|---|---|---|---|
| 3,683,303 | 8/1972 | Ayano et al. | 336/96 |
| 4,064,472 | 12/1977 | Gunewarden et al. | 336/96 X |
| 4,260,850 | 4/1981 | Brown et al. | 174/52 PE X |
| 4,594,644 | 6/1986 | Painter | 336/96 X |

Primary Examiner—Howard N. Goldberg
Assistant Examiner—Taylor J. Ross
Attorney, Agent, or Firm—McGlew and Tuttle

[57] ABSTRACT

A minaturized magnetically-shielded potted electronic component such as a reed relay, is manufactured by first producing a casing by etching a u-metal sheet to produce a casing blank together with fold lines thereon, the blank then being folded to produce a casing part 10 completed by insulating plastics material end walls 21 located between turned-over end wall sections 16,17 integral with the casing side walls 12,13. The reed relay insert 24 and operating coil 25 are mounted on a lead frame 23 including pins 27,28 and then the components are positioned within the casing 10 the lead frame 23 engaging grooves 22 in the end walls 21. The space within the casing surrounding reed relay is then filled with a potting compound and the relay completed by removing the salvage bar 31 from the lead frame 23.

10 Claims, 1 Drawing Figure

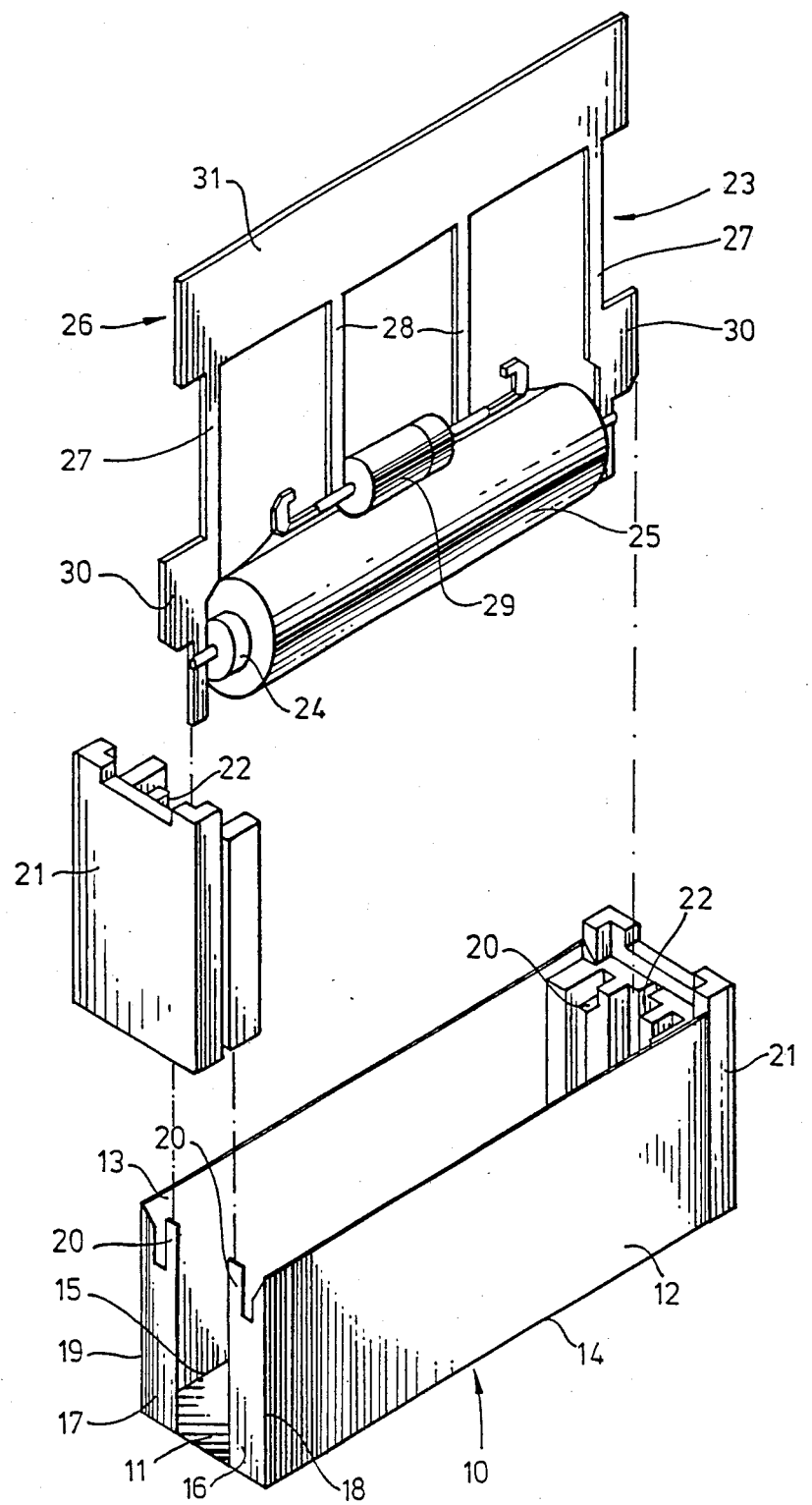

METHOD OF MAKING POTTED ELECTRONIC COMPONENTS

BACKGROUND OF THE INVENTION (a) Field of the Invention

This invention relates to a method of potting an electronic component, and also to potted electronic components per se.

This invention is especially suitable for use in connection with the manufacture of reed relays, though it may be used for the manufacture of a variety of other electronic and electrical components. In the following, reference will mostly be made to reed relays, but it will be appreciated that the invention is not limited to such electronic components.

(b) Description of the Prior Art

Electronic components for use in the construction of electronic circuits frequently are "potted"—that is to say, encapsulated within a polymerised synthetic resin material. When potted in this way, a component is hermetically sealed from the ambient and also is protected against physical damage. In addition, depending upon the resinous potting compound employed, potting may be particularly advantageous for components subjected to high voltages, to minimise the risk of insulation breakdown.

A minature reed relay usually consists of the contact elements contained within an envelope (known as the 'insert') and an operating coil within the core of which is positioned the insert. It is a common practice to encapsulate the insert together with its operating coil, so as to hold the reed relay insert and its operating coil in the required relative disposition, as well as to protect the relatively delicate coil and relay insert against mechanical damage. However, potting a reed relay inevitably increases the bulk of the relay, and this can lead to problems when it is desired to pack a number of such relays into a relatively small space on a printed circuit board.

When a plurality of reed relays are arranged very close to one another on a printed circuit board, problems may arise due to magnetic interaction between the coils of adjacent relays. Thus, though the operating characteristics of a complete reed relay may be determined for that relay in isolation, the characteristics may be significantly altered—and particularly the operating voltage of the relay—when a number of relays are packed closely together.

In an attempt to overcome the above-stated problem, it is known to enclose a reed relay within an envelope or casing which is made of a metal having a high magnetic permeability, so as to magnetically isolate the relay within the casing. When the bulk of a completed relay is not important, magnetic isolation can easily be achieved in this way, but it has proved to be extremely difficult to effectively isolate a reed relay when the overall size of the relay is to be reduced to the smallest possible dimensions to permit very high packing densities for such relays on a printed circuit board.

Conventionally, casings for magnetic screening are made either from soft iron or $\mu$-metal using a deep drawing technique or—in the case of relatively large components—a conventional case-manufacturing technique. However, especially when using $\mu$-metal, experience has shown that it is very difficult to reduce the wall thickness of a deep drawn casing to below 0.5 mm—and inevitably this therefore considerably increases the overall size of an electronic component potted within such a casing.

OBJECTS OF THE INVENTION

It is a principal object of this invention to provide a method of constructing a potted electronic component (such as a reed relay), which permits maximum miniaturisation compatible with the required performance for the component.

It is a further object of this invention to provide a method of constructing a potted electronic component which is itself sensitive to stray magnetic fields, whereby the component is shielded magnetically so as to reduce susceptibility to any stray fields.

Yet another object is to provide a method of constructing a potted electronic component which method is relatively easy and cheap to perform and yet which allows the production of a minaturised and magnetically-shielded component.

A further object of this invention is to provide a method of manufacturing a minaturised relay assembly which is protected against stray magnetic fields.

Other objects of the invention include the provision of a minaturised reed relay assembly which has the reed relay insert and associated coil potted within a casing affording significant magnetic shielding for the insert.

SUMMARY OF THE INVENTION

In accordance with the foregoing and other objects, one aspect of this invention provides a method of constructing a potted electronic component, comprising the steps of:

preparing a casing blank from sheet metal;

folding said casing blank to form at least a bottom wall and two opposed side walls depending from two opposed edges respectively of said bottom wall;

moulding two end walls from a plastics material, each moulded end wall defining a component-locating portion;

assembling said two end walls with the folded blank by positioning one said end wall at each end respectively of the folded blank thereby to complete the casing, said component-locating portion of each end wall being directed inwardly of the casing;

positioning within the casing the electronic component to be potted therewithin, the component being supported by inter-engagement with the component-locating portions of said two end walls; and then filling the free space within the casing around the component with a polymerisable potting compound.

Further, the invention also provides a cased electronic component comprising a casing having a bottom wall, a pair of opposed side walls and a pair of opposed end walls, the bottom and side walls and a pair of opposed end walls, the bottom and side walls being formed from a metallic material appropriately folded from a blank and the end walls being formed at least partially from a plastics material and being interengaged with the said metallic walls, at least one electronic component, including connecting leads, which component is disposed within the casing with said connecting leads projecting from the casing through the space defined by the free edges of the side and end walls, the component being held in place by interengagement with said end walls, and the space around the electronic component but within the casing being filled with a polymerised potting compound.

This invention also extends to a cased electronic component whenever constructed by a method as described above.

The invention will in the following be explained in greater detail and certain preferred arrangements thereof will be described, along with one particular example of a specific manufacturing method to produce a potted minature reed relay.

BRIEF DESCRIPTION OF THE DRAWINGS

In describing the preferred example of manufacturing method of this invention, reference will be made to the accompanying drawings which show the components employed in producing a potted reed relay, separated one from another for clarity.

DESCRIPTION OF THE PREFERRED EMBODIMENTS

In performing the method of this invention, the metallic part of the casing is formed by a folding operation on a pre-shaped blank. In this way, the wall thickness of the metal may be reduced to an absolute minimum value sufficient to give adequate magnetic screening—and typically in the case of a $\mu$-metal casing, the wall thickness may be reduced down to as little as 0.125 mm (i.e. about 0.005 inch) or possibly even thinner.

In performing the method of this invention, the metallic part of the casing is formed by a folding operation on a pre-shaped blank. In this way, the wall thickness of the metal may be reduced to an absolute minimum value sufficient to give adequate magnetic screening—and typically in the case of a $\mu$-metal casing, the wall thickness may be reduced down to as little as 0.125 mm (i.e. about 0.005 inch) or possibly even thinner. In order to facilitate the folding of the blank it is convenient to provide score lines in the material of the blank where the material is to be folded, so as thus to give sharp corners and a casing of precisely controlled dimensions.

It is preferred for the casing blank to be prepared by an etching process, from a sheet of the material from which the casing is to be made. Simultaneous with the etching of the overall shape of the blank, the score lines for folding also may be etched into the material - typically to a depth of 50% of the overall material thickness. Also, any required wording, type designations or the like may be etched into the material, at this stage.

In addition to providing the bottom wall and two opposed side walls for the casing, it is preferred for the blank to be folded also to provide end wall sections, folded round to lie at 90° to the side walls, at each edge thereof extending perpendicular to the bottom wall, when folded. Such end wall sections should extend towards each other but preferably define a gap therebetween. These sections then may serve to support the plastics material end walls, for example by engaging grooves appropriately formed in the end walls. Moreover, the end wall sections will enhance the magnetic screening provided by the casing, by continuing that screening at least partially around the end wall regions.

For the preferred form of casing described above, each end wall section advantageously includes a bendable tab, which may be deformed out of the general plane of the end wall section when an end wall has been engaged with the two end wall sections, so as thereafter to restrain withdrawal or removal of the end wall, prior to potting.

Conveniently, the component-locating portion of each end wall comprises an inwardly-directed groove formed in the end wall and extending towards the bottom wall from the edge of the end wall opposed to the bottom wall, the groove stopping short of the bottom wall such that a component located by the grooves of the two opposed end walls will be held clear of all the metallic walls of the casing.

Depending upon the nature of the electronic component to be located within the casing, the component may be held in the required position prior to potting merely by inter-engagement of its own connecting leads with the end wall component-locating portions. Particularly where more than one component is to be positioned within the casing—for example, a reed relay insert, its operating coil surrounding that insert and possibly also a shunt diode—it may be advantageous to employ a known form of lead frame, with the electronic components soldered or otherwise electrically connected to the lead frame. The lead frame is then itself held in the required position by the component-locating portion of the end walls. After potting has been completed, the support strip of the lead frame may be removed, to leave connecting pins projecting from the casing. The use of such lead frames is known in the integrated circuit art and will not therefore be described in further detail here.

The preferred specific example of manufacturing method for a potted reed relay will now be described in detail, referring to the drawing.

The constructional method described below is intended for the production of reed relays which may be mounted at 0.2 inch (5.08 mm) centres, while still giving adequate magnetic separation to prevent interaction of adjacent relays, notwithstanding the very high packing densities which may be achieved.

Initially, a casing blank is formed from a sheet of $\mu$-metal of approximately 0.005 inch (0.127 mm) thickness, by an etching technique. The etching should be performed both to give the overall shape required for the blank, and also fold lines and such wording and other designations as are required on the completed product, which fold lines and wording should be etched typically to a depth of not more than 50% of the $\mu$-metal thickness. Conveniently, a plurality of such blanks are all etched at the same time, from a relatively large sheet of the material.

Following separation of the blanks from the sheet of material, the blank is folded to produce the casing-part 10 shown in the drawings. This casing-part includes a bottom wall 11, two side walls 12 and 13 connected to the bottom wall 11 by fold lines 14 and 15 respectively and, at each end of the casing, a pair of end wall sections 16 and 17 connected to the respective side walls 12 and 13 by fold lines 18 and 19 respectively. The bottom wall 11 and side walls 12 and 13 are rectangular in shape, and the end wall sections 16 and 17, through generally rectangular, include tabs 20 adjacent their free ends, for a purpose to be described below. Also, there is a gap between the two end wall sections 16 and 17, as shown in the drawings.

The casing is completed by means of two end walls 21, each of which includes a pair of grooves adapted for inter-engagement with the end wall sections 16 and 17. Once so engaged, the tabs 20 are turned over to restrain withdrawal of the end walls, as illustrated on the right-hand end of the construction shown in the accompanying drawing. Each end wall 21 also includes a component-locating groove 22, extending towards but not up to, the bottom wall 11.

Separately, a component sub-assembly 23 is manufactured for positioning within the space defined by the casing. This sub-assembly includes a reed relay insert 24 carrying its operating coil 25 directly therearound, the insert 24 and coil 25 being carried by a lead frame 26, which may also be produced by etching typically from nickel-iron, which then is tin plated. The relay insert leads 26 are welded to pins 27 of the frame, and the coil ends are soldered to pins 28 of the frame. Also, a diode 29 is soldered across the pins 28.

Pins 27 of the lead frame each have lugs 30 adapted to be received in the grooves 22 of the two end walls 21 respectively of the casing. These lugs 30 are so disposed that with the sub-assembly pushed fully home within the casing, none of the components carried by the lead frame, nor the pins of that lead frame contact the metallic casing parts. Then, an appropriate resinous potting compound is run into the casing so as wholly to surround the components therewithin. After curing of the potting compound, the salvage bar 31 of the lead frame is broken away, to leave the pins 27 and 28 projecting from the casing, through the potting compound, so completing the relay.

Though in the foregoing exclusive reference has been made to the production of miniaturised potted reed relays, it will be appreciated that the manufacturing technique may be employed for the production of other potted components, especially where miniaturisation is of particular importance. Other changes and variations equally are possible without departing from the spirit and scope of this invention, as defined by the following claims.

I claim:

1. A method of constructing a potted electronic component, comprising the steps of:
    preparing a casing blank from sheet metal;
    folding said casing blank to form at least a bottom wall and two opposed side walls depending from two opposed edges respectively of said bottom wall;
    moulding two end walls from a plastics material, each moulded end wall defining a component-locating portion;
    assembling said two end walls with the folded blank to complete the casing, positioning one said end wall at each end respectively of the folded blank thereby to complete the casing, said component-locating portion of each end wall being directed inwardly of the casing;
    positioning within the casing the electronic component to be potted therewithin, the component being supported by inter-engagement with the component-locating portions of said two end walls; and then
    filling the free space within the casing around the component with a polymerisable potting compound.

2. A method according to claim 1, in which score lines are formed in the material of the blank along the lines where the material is to be folded, whereby sharp corners are obtained during the folding step.

3. A method according to claim 1, in which said casing blank is prepared by an etching process from a sheet of the metal material from which the casing is to be made.

4. A method according to claim 3, in which simultaneous with the etching of the overall shape of said blank, score lines are etched along the lines where the blank is to be folded to form the casing.

5. A method according to claim 1, in which said blank is prepared so as to provide end wall sections when the blank is folded, which said end wall sections lie at substantially 90° to said side walls, along the edges thereof extending perpendicular to the bottom wall, following folding of the blank.

6. A method according to claim 5, in which said end wall sections are folded so as to extend towards each other but leaving a gap therebetween, said end walls being positioned in each of said gaps.

7. A method according to claim 6, in which each said end wall section includes a bendable tab, which said tab is deformed out of the general plane of the end wall section following the engagement of an end wall therewith, the deformed tab thereafter restraining removal of said end wall, prior to the filling of the casing with said potting compound.

8. A method according to claim 1, in which said component-locating portion of each end wall is formed as an inwardly-directed groove extending along said end wall towards said bottom wall from the edge of said end wall opposed to the bottom wall, said groove stopping short of said bottom wall such that when a component is located within the casing by interengagement with the grooves of the two opposed end walls, the component is held clear of all the metallic walls of the casing.

9. A method according to claim 1, which further includes the step of mounting the electronic component to be located within said casing on a lead frame, and said lead frame is then positioned within said casing prior to the filling thereof with potting compound.

10. A method of constructing a potted reed relay, comprising the steps of:
    preparing a casing blank by an etching process from a μ-metal sheet, the etching porcess forming in the blank fold lines between distinct regions defining a bottom wall, two side walls and two pairs of end wall sections;
    folding said casing blank along said fold lines so as to form a casing part including a bottom wall, two spaced parallel side walls depending from opposed edges of said bottom wall, and pairs of co-planar end wall sections extending at substantially 90° to both the adjacent side and bottom walls, there being a gap between each pair of end wall sections;
    moulding two end walls from a plastics material, each said end wall having grooves in a pair of opposed edges and having a further groove extending partway across a face thereof;
    assembling said two end walls with the folded blank by positioning each end wall in the gap between said end wall sections with the edges of said sections lying in said grooves of the end wall, and with said further groove being directed inwardly of the casing;
    providing a lead frame having a plurality of pins projecting from a salvage bar and mounting a reed relay insert and an operating coil therefore on said pins;
    positioning said insert and coil within said casing by locating said lead frame in said further grooves of said end walls with said salvage bar external of said casing;
    filling the free space within the casing around the component with a polymerisable potting compound; and then
    removing the salvage bar from the lead frame so leaving the pins thereof projecting from the potting compound.

* * * * *